(12) United States Patent
Hu

(10) Patent No.: US 7,282,443 B2
(45) Date of Patent: Oct. 16, 2007

(54) METHODS OF FORMING METAL SILICIDE

(75) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 10/609,282

(22) Filed: Jun. 26, 2003

(65) Prior Publication Data

US 2004/0266153 A1 Dec. 30, 2004

(51) Int. Cl.
*H01L 21/44* (2006.01)

(52) U.S. Cl. .............................. 438/655; 257/E21.593

(58) Field of Classification Search ................ 438/630, 438/649, 655, 658, 660, 663–664, 682–683, 438/685–686, 592
See application file for complete search history.

(56) References Cited

U.S. PATENT DOCUMENTS

| | | | |
|---|---|---|---|
| 4,886,764 A | 12/1989 | Miller et al. | |
| 5,824,600 A * | 10/1998 | Byun et al. | 438/682 |
| 5,852,319 A | 12/1998 | Kim et al. | |
| 5,973,351 A | 10/1999 | Kotecki et al. | |
| 5,997,634 A | 12/1999 | Sandhu et al. | |
| 6,090,708 A | 7/2000 | Sandhu et al. | |
| 6,187,679 B1 | 2/2001 | Cabral, Jr. et al. | |
| 6,294,434 B1 | 9/2001 | Tseng | |
| 6,306,766 B1 | 10/2001 | Sandhu et al. | |
| 6,358,788 B1 | 3/2002 | Chen et al. | |
| 6,362,086 B2 | 3/2002 | Weimer et al. | |
| 6,403,458 B2 * | 6/2002 | Trivedi et al. | 438/618 |
| 6,451,679 B1 * | 9/2002 | Hu et al. | 438/592 |
| 6,537,910 B1 * | 3/2003 | Burke et al. | 438/680 |
| 6,613,673 B2 * | 9/2003 | Pan et al. | 438/689 |
| 6,774,023 B1 * | 8/2004 | Paek et al. | 438/592 |
| 2002/0022366 A1 * | 2/2002 | Cabral et al. | 438/682 |
| 2002/0111018 A1 * | 8/2002 | Tai | 438/655 |

FOREIGN PATENT DOCUMENTS

| | | | |
|---|---|---|---|
| JP | 57194548 A | * | 11/1982 |
| JP | 63128732 A | * | 6/1988 |

OTHER PUBLICATIONS

"Mechanisms for enhanced C54-TiSi$_2$ formation in Ti-Ta alloy films on single-crystal Si"; A. Quintero et al.; Journal of Materials Research; vol. 14, No. 12 Dec. 1999 pp. 4690-4700.

(Continued)

*Primary Examiner*—Scott B. Geyer
*Assistant Examiner*—Reema Patel
(74) *Attorney, Agent, or Firm*—Wells St. John P.S.

(57) ABSTRACT

The invention includes methods of forming metal silicide having bulk resistance of less than 30 micro-ohms-centimeter. The metal of the metal silicide can be selected from Groups 3, 4, 8, 9 and 10 of the periodic table, with an exemplary metal being titanium. An exemplary method includes forming a titanium-containing layer directly against tantalum silicide. After the titanium-containing layer is formed directly against the tantalum silicide, titanium of the titanium-containing layer is converted to titanium silicide. Constructions formed in accordance with methodology of the present invention can be incorporated into circuitry associated with semiconductor devices, such as, for example, wordlines and bitlines.

6 Claims, 6 Drawing Sheets

OTHER PUBLICATIONS

"*Enhanced formation of the C54 TiSi$_2$ by an interposed layer of molybdenum*"; A. Mouroux et al.; Appl. Phys. Lett. 69 (7), Aug. 12, 1996; © 1996 American Institute of Physics.

"*Low temperature formation of C54-TiSi$_2$ using titanium alloys*", C. Cabral, Jr. Et al; Appl./ Phys. Lett. 71 (24) Dec. 15, 1997 © 1997 American Institute of Physics; pp. 3531-3533.

* cited by examiner

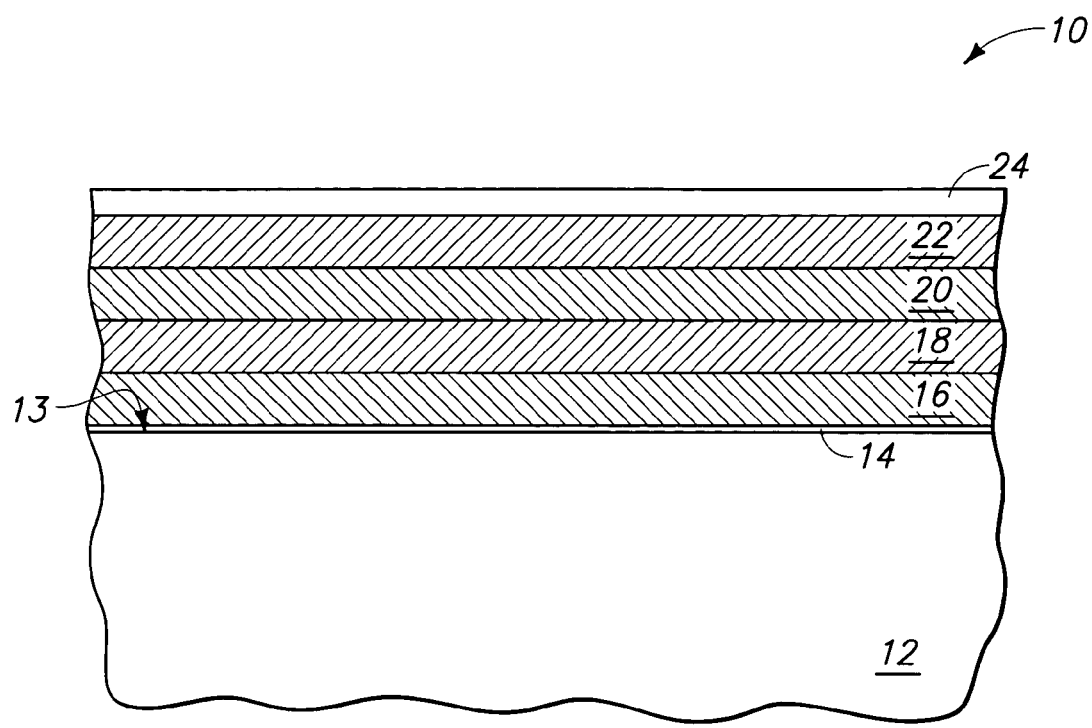
_Fig. 1_
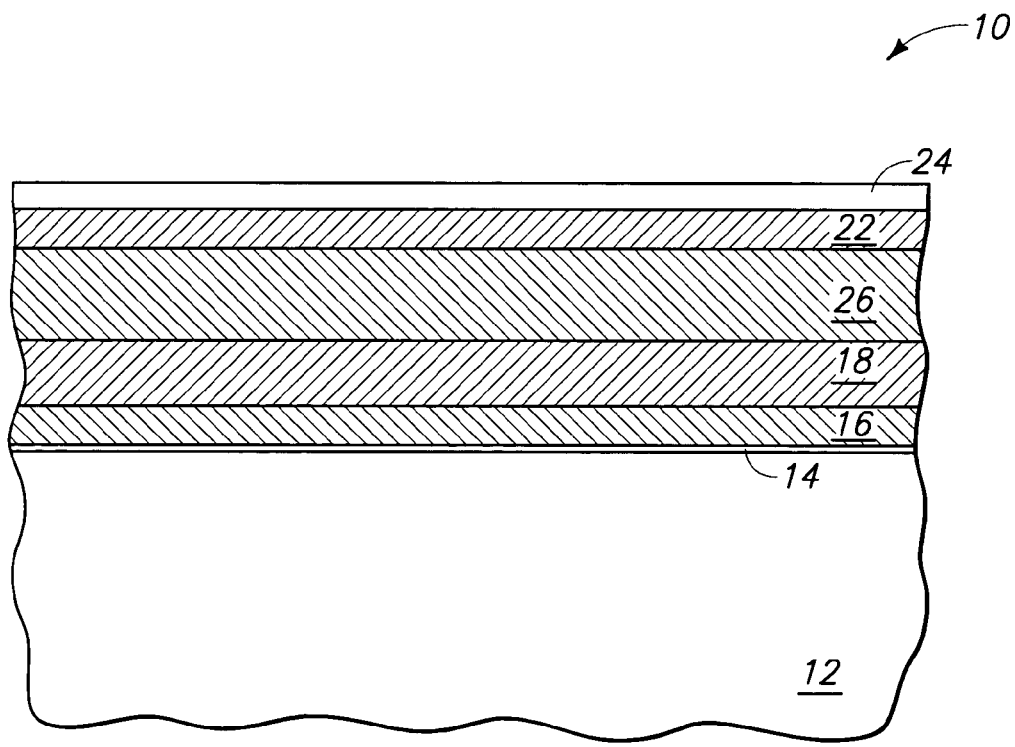
_Fig. 2_

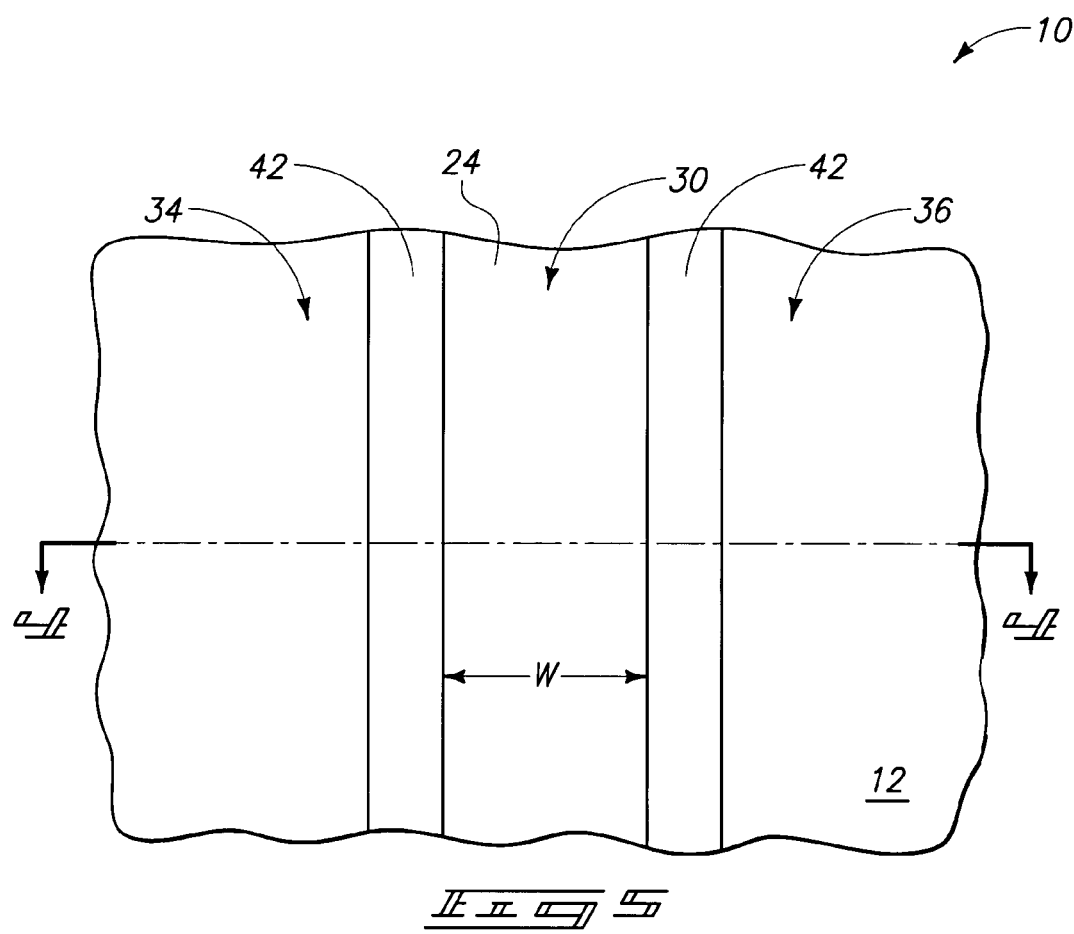
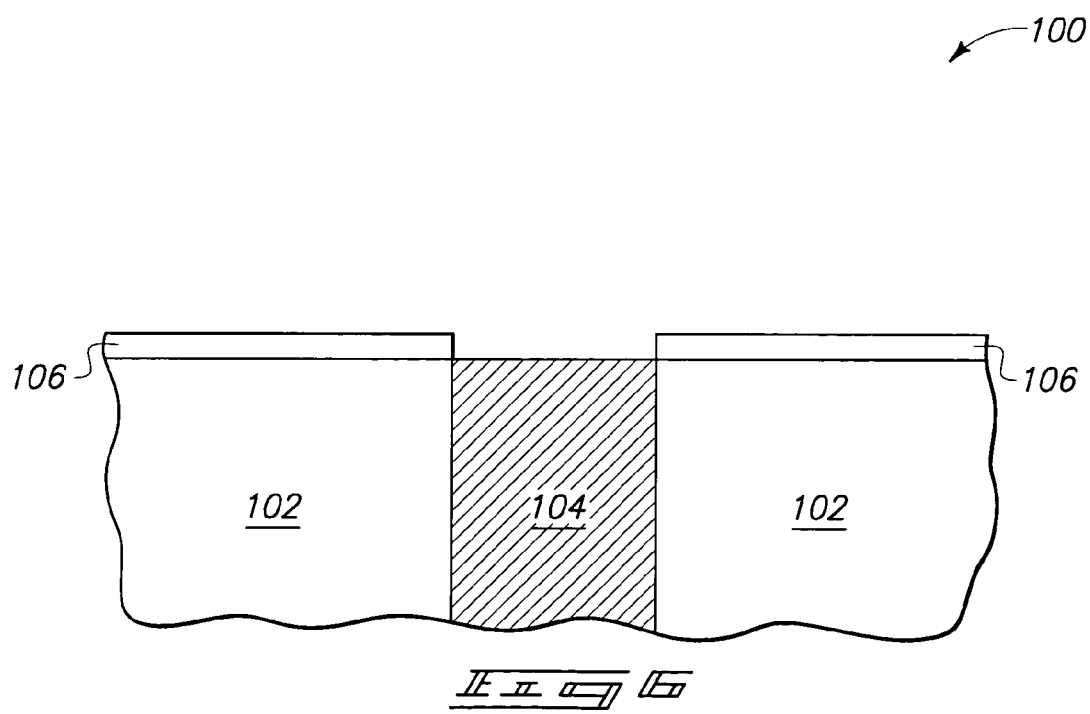

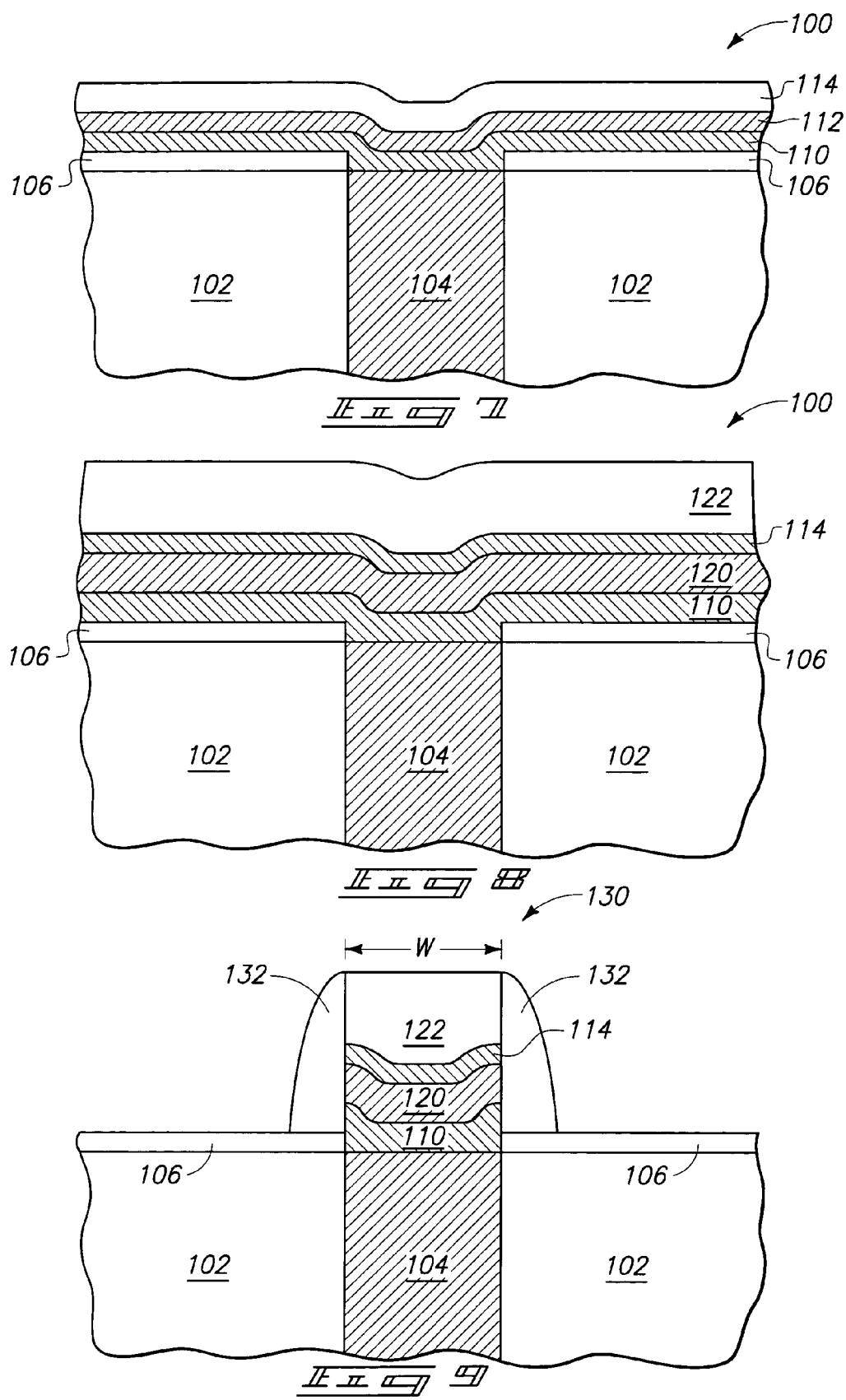

METHODS OF FORMING METAL SILICIDE

TECHNICAL FIELD

The invention pertains to methods of forming metal silicide, and also pertains to constructions comprising metal silicide.

BACKGROUND OF THE INVENTION

Titanium silicide is commonly incorporated into semiconductor devices. Titanium silicide has advantages of low resistivity, the ability to be self-aligned, and reasonable thermal stability. However, the polymorphic characteristics of titanium silicide create various problems. For instance, titanium silicide ($TiSi_2$) typically exists in either an orthorhombic base-centered phase having 12 atoms per unit cell and a resistivity of about 60 to 90 micro-ohm-cm (which is known as the C49 phase), or as a more thermodynamically-favored orthorhombic face-centered phase which has 24 atoms per unit cell and a resistivity of about 12-20 micro-ohm-cm (which is known as the C54 phase). It is common for the less-desired C49 phase to be initially deposited under typical processing conditions. The C49 phase is then converted to the desired C54 phase through an appropriate high-temperature annealing step. However, the annealing step can have detrimental effects on the silicide and other integrated circuit elements, particularly at small line-widths.

An exemplary set of processing conditions for forming titanium silicide includes: (1) pre-cleaning of a surface onto which the silicide is to be formed, (2) titanium deposition, (3) silicide formation at a temperature of less than about 700° C., (4) selective patterning of the silicide, and (5) phase transformation of the silicide from the C49 phase to the C54 phase at a temperature greater than about 700° C. The temperature utilized for the conversion of the C49 phase to the C54 phase is typically at least 50° C. above the formation temperature of the C54 phase in order to insure full transformation to the C54 phase.

A possible reason for the C49 phase forming first is because such has a lower surface energy than the C54 phase, and the higher surface energy of the C54 phase creates a significant energy barrier to formation of the C54 phase. The annealing of titanium silicide in the C49 phase overcomes the energy barrier associated with formation of the C54 phase, and thus enables growth of the C54 phase. A problem with the transformation from the C49 phase to the C54 phase is agglomeration. If the thermal energy utilized to obtain the phase transformation is excessive, a morphological degradation of the titanium suicide can result, resulting in agglomeration of the silicide. As the amount of silicide decreases due to decreasing line-widths and decreasing thicknesses of silicide film, the thermal energy needed to cause the transformation from the C49 phase to the C54 phase increases, and yet the thermal energy level at which the silicide film starts to agglomerate decreases. Thus, the process window for performing the phase transformation from the C49 phase to the C54 phase is narrowed, creating increasingly stringent tolerances for control of the transformation from the C49 phase to the C54 phase in order to avoid undesired agglomeration.

The processing conditions described above for formation of titanium silicide often involve formation of titanium directly on silicon, and subsequent formation of silicide from reaction of the titanium with the silicon. Recently, it was found that agglomeration problems can be reduced if a thin film of refractory metal is provided between the titanium and the silicon prior to formation of titanium silicide. Suitable refractory metals are those which are capable of forming metal silicide, and can include, for example, molybdenum, tungsten, tantalum, niobium, vanadium, and chromium, as discussed in, for example, U.S. Pat. No. 6,187,679. However, there can be difficulties in utilizing such methodologies in that if the layer of refractory metal is not kept very thin there will frequently not be suitable formation of titanium silicide over the refractory metal. Specifically, the titanium silicide will either not entirely convert to $TiSi_2$ (instead the titanium silicide will have a composition of $TiSi_x$, with x being greater than 0 and less than 2) and/or the titanium silicide will not entirely convert to the desired C54 phase. Accordingly, it is desired to develop improved methods for forming titanium silicide. Also, even though titanium silicide is currently a commonly utilized silicide in semiconductor devices, there are other silicides which can have suitable characteristics for incorporation into various semiconductor devices, and it would be desirable if the methodologies developed for improved formation of titanium silicide could be extended to suicides other than titanium silicide.

SUMMARY OF THE INVENTION

In one aspect, the invention encompasses a method of forming low resistance metal silicide (i.e., metal silicide having a bulk resistance of less than 30 micro-ohm-centimeter) comprising one or more transition metals. A first metal silicide is formed over a substrate. The first metal silicide consists essentially of $MSi_x$, where x is greater than 0 and less than or equal to 2, and where M represents at least one metal. The first metal silicide typically has a melting point higher than 1700° C. The first metal silicide has a thickness of at least about 50 Å. A metal-containing layer is formed directly against the first metal silicide. The metal-containing layer comprises one or more metals different from the metal of the metal silicide, and which have corresponding low resistance metal suicides. The metal-containing layer can, for example, predominantly comprise titanium. The metal-containing layer is converted to a low resistance silicide while it is directly against the first metal silicide layer. The silicide formed from the second metal-containing layer can be referred to as a second metal silicide, and can be represented as $QSi_2$, where Q is represents a metal. The second metal silicide can have a thickness of at least about 100 Å.

In one aspect, the invention encompasses a method of forming metal silicide comprising metal from one or more of Groups 3, 4, 8, 9 and 10 of the periodic table, with Groups 3, 4, 8, 9 and 10 corresponding to the new IUPAC format (i.e., with Groups 3, 4, 8, 9 and 10 being the Groups comprising Sc, Ti, Fe, Co and Ni, respectively), which will be the format utilized throughout this disclosure. A first metal silicide is formed over a substrate. The first metal silicide is $MSi_x$, where x is greater than 0 and less than or equal to 2, and where M represents one or more refractory metals. The first metal silicide has a thickness of at least about 50 Å. A metal-containing layer is formed directly against the first metal silicide. The metal-containing layer comprises one or more metals selected from Groups 3, 4, 8, 9 and 10 of the periodic table, and can, for example, predominantly comprise titanium. The metal-containing layer is converted to a silicide while it is directly against the first metal silicide layer. The silicide formed from the metal-containing layer can be referred to as a second metal silicide, and can be represented as $QSi_2$, where Q represents one or more elements selected from Groups 3, 4, 8, 9 and 10 of the periodic table. The second metal silicide can have a thickness of at least about 100 Å.

In one aspect of the invention, a method of forming titanium silicide comprises the following. Initially, a metal silicide is formed over a substrate. The metal silicide is $MSi_x$, and has a melting point greater than 1700° C. The x of $MSi_x$ is greater than 0 and less than or equal to 2, and M represents at least one refractory metal, (with M comprising, for example, one or more of Hf, Mo, Ta and W). The metal silicide layer can have a thickness of, for example, at least about 50 Å. A titanium-containing layer is formed directly against the metal silicide layer, with the titanium of the titanium-containing layer being in a form other than $TiSi_2$. After the titanium-containing layer is formed directly against the metal silicide layer, the titanium is converted to $TiSi_2$.

The invention also comprises integrated circuits comprising two metal silicide layers directly against one another, with one of the metal silicide layers predominantly being $MSi_2$, where M represents one or more metals and where the $MSi_2$ has a melting point greater than 1700° C. The other of the metal silicide layers is predominantly $QSi_2$, where Q represents one or more transition metals different from M and $QSi_2$ has a net bulk resistance of less than 30 micro-ohm-centimeter. Alternatively, or additionally, M is selected from Groups of the periodic table other than Groups 3, 8, 9 and 10; and Q is selected from Groups 3, 4, 8, 9 and 10 of the periodic table. Constructions comprising the pair of metal silicide layers in accordance with aspects of the invention can include, for example, wordlines and bitlines. In particular aspects, the wordlines and/or bitlines can be incorporated into dynamic random access memory (DRAM) arrays, and such arrays can be incorporated into electronic systems.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment at a preliminary processing stage of an exemplary aspect of the present invention.

FIG. 2 is a view of the FIG. 1 wafer fragment shown at a processing stage subsequent to that of FIG. 1.

FIG. 5 is a diagrammatic top view of a portion of a semiconductor wafer comprising the fragment of FIG. 4. The line 4-4 of FIG. 5 illustrates the location of the cross-section of FIG. 4.

FIG. 6 is a diagrammatic, cross-sectional view of a semiconductor wafer fragment at a preliminary processing stage of a second exemplary aspect of the present invention.

FIG. 7 is a view of the FIG. 6 fragment shown at a processing stage subsequent to that of FIG. 6.

FIG. 8 is a view of the FIG. 6 fragment shown at a processing stage subsequent to that of FIG. 7.

FIG. 9 is a view of the FIG. 6 fragment shown at a processing stage subsequent to that of FIG. 8.

DETAILED DESCRIPTION OF THE PREFERRED EMBODIMENTS

Figure 3:
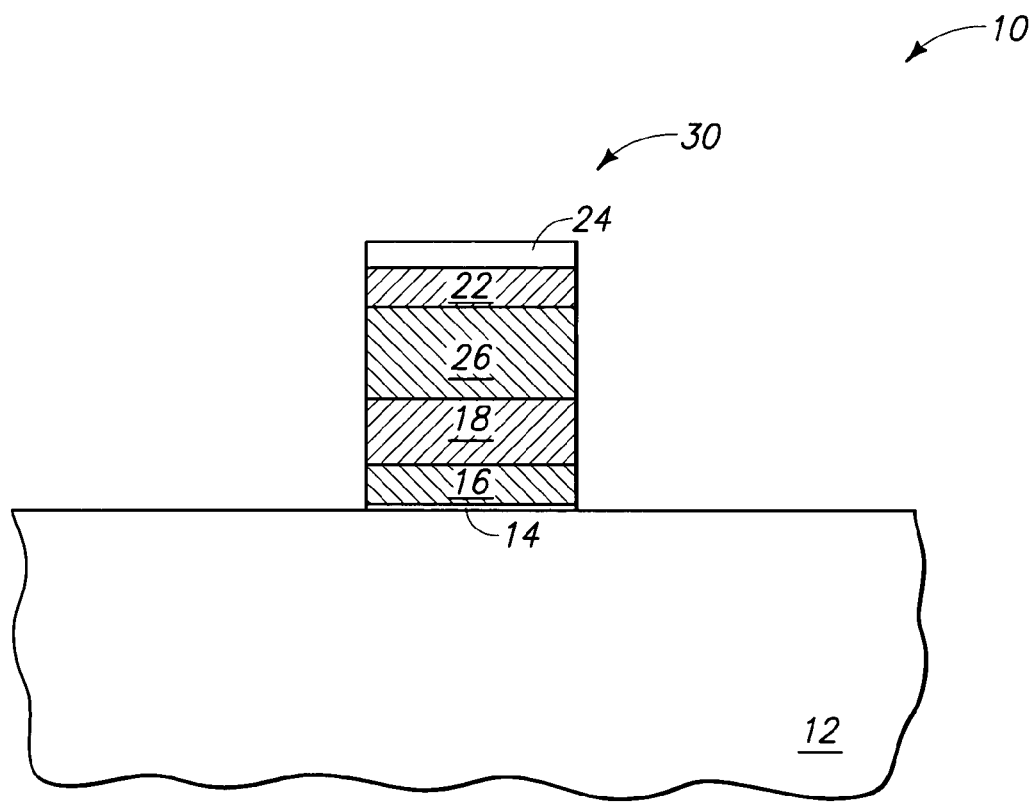
FIG. 3 is a view of the FIG. 1 wafer fragment shown at a processing stage subsequent to that of FIG. 2.

This disclosure of the invention is submitted in furtherance of the constitutional purposes of the U.S. patent Laws "to promote the progress of science and useful arts" (Article 1, Section 8).

The invention includes methods for forming low resistance metal silicides (i.e., metal suicides having bulk resistance of less than 30 micro-ohm-centimeter). Exemplary metals which can be included in the low resistance metal silicides are titanium (Ti), zirconium (Zr), scandium (Sc), yttrium (Y), cobalt (Co), nickel (Ni), palladium (Pd), platinum (Pt) and Iridium (Ir). In particular aspects of the invention, the metal of the metal silicide can consist of one or more elements selected from metals of Groups 3, 4, 8, 9 and 10 of the periodic table.

If the invention is utilized to form titanium silicide, a C54 phase transformation temperature can be lowered by at least 100° C. relative to various prior art methods.

The methodology of the present invention can be utilized for forming various integrated circuit components, with exemplary components being wordlines and bitlines. An exemplary process of forming a wordline is described with reference to FIGS. 1-5, and an exemplary process of forming a bitline is described with reference to FIGS. 6-9.

Referring initially to FIG. 1, a semiconductor wafer fragment 10 is illustrated at a preliminary processing stage. Fragment 10 comprises a semiconductor substrate 12, which can include, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 has an upper surface 13, and an insulative layer 14 is formed over such upper surface. In the shown aspect of the invention, the insulative layer 14 is formed directly against the upper surface 13. Insulative material 14 can, for example, comprise, consist essentially of, or consist of silicon dioxide.

A silicon-containing layer 16 is formed over insulative material 14, and is shown formed directly against insulative material 14. The silicon within silicon-containing layer 16 can be in any suitable form, and can, for example, be amorphous and/or polycrystalline. Layer 16 can comprise, consist essentially of, or consist of silicon or Si/Ge, and is shown to be electrically conductive. Layer 16 can be rendered electrically conductive by providing one or more suitable conductivity-enhancing dopants within the silicon-containing layer.

A metal silicide layer 18 is formed over silicon-containing layer 16, and is shown formed directly against silicon-containing layer 16. For purposes of interpreting this disclosure and the claims that follow, a "metal silicide layer" is any layer comprising metal silicide. Accordingly, the term "metal silicide layer" can encompass layers comprising, consisting essentially of, or consisting of metal silicide.

Metal silicide layer 18 can be, as discussed below, metal-enriched and thus not stoichiometrically saturated with Si. Metal silicide layer 18 typically has a melting point greater than 1700° C. The metal of silicide layer 18 can be, in some aspects of the invention, one or more refractory metals; alternatively, or additionally, the metal of silicide layer 18 can be selected from Groups of the periodic table other than Groups 3, 8, 9 and 10. In particular aspects, the metal of metal silicide 18 can predominantly comprise, consist essentially of, or consist of one or more refractory metals selected from the group consisting of Hf, Mo, Ta and W. For purposes of interpreting this disclosure and the claims that follow, a metal-containing composition is to be understood to "predominantly comprise" one or more stated metals if such one or more stated metals constitute more than 50 atomic percent of the total metal within the metal-containing layer. A metal that is at least 50 atomic percent of the total metal content of metal silicide layer 18 can be referred to as a predominate metal of the layer. If metal silicide layer 18 contains only one metal, the metal of the layer can be considered to consist of the predominate metal.

Particular metals suitable for incorporation into layer 18 are one or more metals selected from the group consisting of hafnium (HF), chromium (Cr), molybdenum (Mo), niobium (Nb), tantalum (Ta), vanadium (V), and tungsten (W); with Hf, Mo, Ta and W being typical. The composition of layer 18 can be represented as $MSi_x$, where x is a number greater than 0 and less than or equal to 2. Typically x will be less than 2 so that the silicide of layer 18 is effectively metal-enriched. In other words, metal silicide having the composition $MSi_2$ can be considered to be the "standard" or "silicon-saturated" form of metal silicide, and metal silicide having a higher ratio of metal to silicon than 1:2 can be considered to be metal-enriched.

A metal-containing layer 20 is formed over metal silicide layer 18. The metal of metal-containing layer 20 can predominantly comprise, consist essentially of, or consist of one or more metals having corresponding low resistance metal silicides, In some aspects, the metal of metal-containing layer 20 can predominantly comprise, consist essentially of, or consist of one or more metals selected from Groups 3, 4, 8, 9 and 10 of the periodic table. In particular aspects, the metal of metal-containing layer 20 will predominantly comprise, consist essentially of, or consist of one or more of Ti, Zr, Sc, Y, Co, Ni, Pd, Pt and Ir. In specific aspects, metal-containing layer 20 can comprise, consist essentially of, or consist of titanium. Metal-containing layer 20 is shown formed directly against a surface of metal silicide 18. Layer 18 can be referred to as an "intermediate" layer in the discussion that follows to indicate that layer 18 is intermediate silicon-containing layer 16 and metal-containing layer 20.

An optional silicon-containing layer 22 is formed over metal-containing layer 20. Silicon-containing layer 22 can comprise any suitable form of silicon, including, for example, one or both of amorphous silicon and polycrystalline silicon. Silicon-containing layer 22 is shown to be electrically conductive, and accordingly is indicated to be conductively-doped with one or more appropriate dopants. It is to be understood, however, that silicon-containing layer 22 can also be substantially undoped at the processing step of FIG. 1 (in other words, can comprise less than $1 \times 10^{18}$ atoms/cm$^3$ of conductivity-enhancing dopant).

An electrically insulative cap 24 is formed over and directly against silicon-containing layer 22. Cap 24 can comprise, for example, silicon nitride, and like layer 22 is optional at the processing stage of FIG. 1.

Exemplary thicknesses for layers 14, 16, 18, 20, 22 and 24 are as follows. Dielectric layer 14 can have a thickness of less than or equal to about 50 Å. Silicon-containing layer 16 can have a thickness of from about 100 Å to about 1500 Å, and typically has a thickness of from about 500 Å to about 1500 Å. Metal silicide layer 18 can have a thickness of from about 50 Å to about 200 Å. Metal-containing layer 20 can have a thickness of from about 50 Å to about 500 Å. Silicon-containing layer 22 can have a thickness of from about 20 Å to about 1500 Å. Insulative cap 24 can have a thickness of greater than about 50 Å.

Layers 14, 16, 18, 20, 22 and 24 can be formed by any suitable methods. Insulative layers 14 and 24, and silicon-containing layers 16 and 22, can be formed by, for example, chemical vapor deposition. Metal silicide layer 18 can be formed by, for example, chemical vapor deposition and/or sputter deposition. In particular aspects, layer 18 can be formed by sputter deposition from a composite target having a desired ratio of silicon to metal. It can be preferred that layer 18 comprise $MSi_x$ where x is from about 0.6 to about 2, and in such aspects the composite target can comprise a ratio of silicon to metal of from about 0.6 to about 2. Metal-containing layer 20 can be formed by, for example, chemical vapor deposition and/or sputter deposition.

As discussed previously, the term "substrate" can mean any supporting material. Accordingly, even though structure 12 is referred to as a "substrate" above, it is to be understood that the term "substrate" can also include various combinations of the structures shown in FIG. 1. For instance, the term "substrate" can include base structure 12 together with layers 14 and 16. In such aspect, the substrate can be considered to be a silicon-containing substrate with an upper silicon-containing surface corresponding to the upper surface of layer 16. Also in such aspect, metal silicide layer 18 can be considered to be formed directly against the silicon-containing substrate.

Structure 10 is subsequently exposed to conditions which convert metal of metal-containing layer 20 to silicide. Preferably, an entirety of the metal within metal-containing layer 20 is converted to silicide. After metal-containing layer has been converted to a silicide, the metal silicide layer 18 can be considered to be a first metal silicide layer, and the converted layer 20 can be considered to be a second metal silicide layer.

The processing utilized to convert metal-containing layer 20 to a silicide can comprise, for example, exposure of layers 16, 18, 20 and 22 to a temperature of from about 600° C. to about 900° C., and typically from about 650° C. to about 700° C., for a time of at least about 30 seconds. Silicon from one or both of layers 16 and 22 interacts with metal of layer 20 to form the metal silicide. Further, if layer 18 is metal-enriched, silicon from one or both of layers 16 and 22 can interact with metal within layer 18 to convert layer 18 to a "standard" metal silicide having the stoichiometry $MSi_2$.

Reaction of silicon with metal of metal-containing layer 20 will cause the layer to expand, and can, in particular aspects, cause the thickness of layer 20 to expand by about a factor of two. Also, if layer 18 is initially metal-enriched, incorporation of additional silicon into layer 18 to form the "standard" metal silicide stoichiometry can cause layer 18 to expand The amount by which a thickness of layer 18 increases will be approximately proportional to the initial metal enrichment of layer 18. The amount of expansion of thickness of layer 18 will be somewhere between about 0 and about a factor of two. Specifically, at one extreme, layer 18 can comprise very little silicon, and accordingly the thickness of layer 18 will expand by about a factor of two. At the other extreme, layer 18 can comprise an amount of silicon sufficient for the stoichiometry to be close to, equal to, or greater than the standard stoichiometry of $MSi_2$, in which case the expansion of layer 18 will be approximately 0. Further, if layer 18 initially comprises an excess of silicon, the layer may even effectively contract as silicon from the layer is incorporated into silicide by reaction with metal-containing layer 20.

FIG. 2 shows construction 10 after conversion of metal-containing layer 20 (FIG. 1) to a metal silicide 26. Metal silicide 26 has a thickness greater than the initial thickness of layer 20 (FIG. 1) for reasons discussed above. Also, metal silicide layer 18 is shown having an increased thickness in FIG. 2 relative to that of FIG. 1, to imply that in the shown embodiment layer 18 was metal-enriched at the processing stage of FIG. 1, and accordingly some expansion of layer 18 occurred as the layer was converted to $MSi_2$. The thicknesses of layers 18 and 26 in FIG. 2 can be, for example, from about 50 Å to about 500 Å, and from about 100 Å to about 1000 Å, respectively. The thicknesses of layers 16 and 22 of FIG. 2 are shown decreased relative to the thickness of the layers in FIG. 1 to indicate that silicon from layers 16 and 22 has been incorporated into layers 18 and 26 during formation of the metal silicides.

As discussed above, silicon-containing layer 22 can be either conductively-doped, or not conductively-doped at the processing stage of FIG. 1. If silicon-containing layer 22 is not conductively-doped during the conversion of metal in layer 20 (FIG. 1) to metal silicide of layer 26 (FIG. 2), the layer 22 can, in particular aspects, be implanted with conductivity-enhancing dopant after such conversion to conductively dope the layer.

One aspect of metal silicide layer 18 during the conversion occurring between FIGS. 1 and 2 is that such can be considered to be a barrier layer having a higher melting point than a metal silicide ultimately formed from layer 20. For instance, if layer 18 comprises $TaSi_x$ (where x is greater than 0 and less than or equal to 2), and layer 20 comprises Ti, the melting point of the $TaSi_x$ will be about 2200° C., whereas $TiSi_2$ has a melting point of about 1540° C. The intermediate layer 18 having the high melting point can prevent agglomeration of titanium during conversion of layer 20 to titanium silicide. The $TaSi_2$ can be considered to be a C40 phase material in some aspects of the invention.

As discussed above in the "Background" section of this disclosure, previous methodologies for forming titanium silicide had utilized a thin layer of refractory metal (such as, for example, tantalum) between a layer of titanium and a layer of silicon during conversion of the layer of titanium to titanium silicide. In other words, the prior art methods used a layer of pure metal instead of the metal silicide 18 of the processing stage of FIG. 1. Also as discussed in the "Background" section of this disclosure, a problem with utilizing the pure metal is that the layer of pure metal had to be kept very thin or agglomeration and/or other undesired effects would occur during formation of the titanium silicide.

The present invention is improved over such prior art methods in that the present invention utilizes metal suicide layer 18, rather than the layer of pure metal. Layer 18 can be relatively thick, (for example, from about 50 Å to about 200 Å) during formation of a titanium silicide thereover (in embodiments in which layer 20 of FIG. 1 comprises titanium), without detrimental effects occurring to the titanium silicide. It is easier to fabricate thick layers than thin layers, for at least the reason that minor differences in uniformity throughout a layer are more significant in thin layers than in thick layers. In other words, a minor uniformity constitutes a higher percentage of a thin layer than a thick layer, which translates into a larger effect from the minor non-uniformity in a thin layer than in a thick layer. For this reason, the metal silicide layer 18 of the present invention is preferably formed to a thickness of at least about 50 Å, and is typically formed even thicker. Accordingly, processing of the present invention can be easier to incorporate into fabrication processes than could prior art processing in which very thin metal films were utilized as intermediate layers during formation of metal silicide.

FIG. 3 shows construction 10 after layers 14, 16, 18, 26, 22 and 24 have been patterned into a line 30. Such patterning can be accomplished utilizing, for example, photolithography followed by an appropriate etch. Specifically, a patterned block of photoresist (not shown) can be formed over layers 14, 16, 18, 26 and 22 to protect a portion of the stack of layers while leaving other portions of the stack exposed to an etch. Subsequently, the etch can be conducted to pattern the stack into the shown line, and the photoresist can then be removed from over the line.

Figure 4:
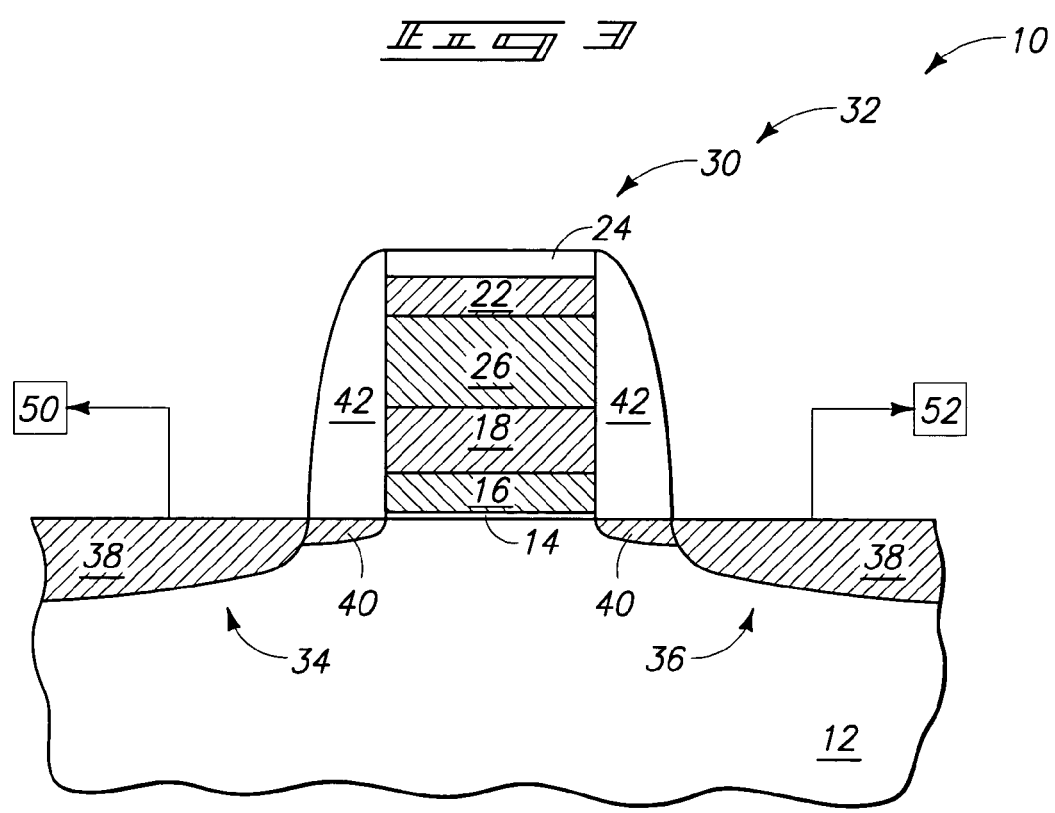
FIG. 4 is a view of the FIG. 1 wafer fragment shown at a processing stage subsequent to that of FIG. 3.

Referring to FIG. 4, line 30 can be utilized as a wordline, and can be fabricated into transistor gate structures at appropriate locations. Specifically, FIG. 4 shows a location where line 30 has been incorporated into a transistor construction 32. Source/drain regions 34 and 36 have been formed within substrate 12. The source/drain regions comprise a deep heavily-doped portion 38 and a shallow lightly-doped portion 40. Source/drain regions 34 and 36 can be formed utilizing conventional methods, and the conductivity-enhancing dopant within regions 34 and 40 can predominantly comprise either p-type dopant or n-type dopant.

Sidewall spacers 42 have been formed along sidewalls of line 30. Spacers 42 can comprise any suitable material, including, for example, silicon nitride and/or silicon dioxide.

Transistor device 32 can be incorporated into a memory cell. In the shown exemplary construction, device 32 is incorporated into a DRAM cell. Specifically, the source/drain region 34 is electrically connected to a storage device 50 and the other source/drain region 36 is electrically connected to a bitline 52. Storage device 50 can comprise any suitable device, including, for example, a capacitor. Bitline 52 can comprise any suitable construction, including, for example, a construction described below with reference to FIG. 9.

Conductive line 30 can be considered to be part of an integrated circuit. Further, conductive line 30 can be considered to comprise a first metal silicide layer 18 over a semiconductor substrate, with the first metal silicide layer predominantly being $MSi_2$, where the $MSi_2$ has a melting point higher than 1700° C., and/or where M is selected from Groups of the periodic table other than Groups 3, 8, 9 and 10. The wordline can be further considered to comprise a second metal silicide layer 26 directly against the first metal silicide layer 18. The second metal silicide layer is predominantly $QSi_2$; where Q is selected such that $QSi_2$ has a bulk resistance of less than 30 micro-ohm-centimeter, and/or where Q is selected from Groups 3, 4, 8, 9 and 10 of the periodic table. In particular aspects, the first metal silicide layer 18 can have a thickness of at least about 50 Å and the second metal silicide layer 26 can have a thickness of at least about 100 Å. The metal "M" of the first metal silicide layer can comprise, for example, one or more of Hf, Cr, Mo, Nb, Ta, V and W; typically will comprise one or more of Hf, Mo, Ta and W; and in particular aspects layer 18 can comprise, consist essentially of, or consist of tantalum silicide. The metal "Q" of the second metal silicide layer can be, for example, one or more of Ti, Zr, Sc, Y, Co, Ni, Pd, Pt and Ir. In particular aspects, the second metal silicide layer will comprise, consist essentially of, or consist of $TiSi_2$. Further, in particular aspects, the first metal silicide layer 18 will have a thickness from about 50 Å to about 500 Å, and the second metal silicide layer 26 will have a thickness from about 100 Å to about 1000 Å.

Metal silicide layer 26 can have a very low resistance. In particular aspects, layer 26 will have a resistance of from about 10 micro-ohm-cm to about 30 micro-ohm-cm, and in exemplary aspects will have a resistance of less than or equal to about 20 micro-ohm-cm.

FIG. 5 shows a top view of a wafer fragment comprising the cross section of FIG. 4. Line 30 is shown to have a width "W" extending from one sidewall edge of the line to an opposing sidewall edge of the line. In particular aspects of the invention, width "W" can be less than or equal to 0.25 micrometers, less than or equal to 0.15 micrometers, and even less than or equal to 0.11 micrometers. Further, in aspects in which metal silicide 26 comprises $TiSi_2$, such metal silicide can have a resistance of less than 20 micro-ohm-cm while the width of line 30 is less than or equal to 0.11 micrometers. The low resistance of a small-width metal silicide layer 26 of the present invention can provide significant advantages relative to prior art constructions, and can enable wordlines of the present invention to be incorporated into very high density integrated circuit constructions.

Referring next to FIG. 6, such illustrates a fragment of a semiconductor construction 100 at a preliminary processing stage of a second exemplary aspect of the present invention. Construction 100 comprises an insulative material 102 and a conductive pedestal 104 extending through the insulative material. Insulative material 102 can comprise, for example, borophosphosilicate glass (BPSG); and conductive pedestal 104 can comprise any suitable conductive material, including, for example, one or more of metal, metal compounds, and/or conductively-doped semiconductive material (such as, for example, silicon).

Materials 102 and 104 can be formed over a monocrystalline silicon wafer (not shown), and accordingly can be utilized to form an integrated circuit associated with a semiconductor wafer.

A patterned insulative material 106 is formed over insulative material 102. An opening extends through patterned material 106 to an upper surface of conductive material 104. Insulative material 106 can comprise any suitable material, including, for example, silicon dioxide formed from a deposition utilizing TEOS (tetraethyl orthosilicate).

Referring to FIG. 7, a metal silicide layer 110 is formed over insulative material 106 and directly against an upper surface of conductive pedestal 104. Metal silicide layer 110 can comprise the compositions described previously relative to metal silicide layer 18 of FIG. 1, and can be formed utilizing methodologies described above relative to metal silicide layer 18.

A metal-containing layer 112 is formed over and directly against metal silicide layer 110. Metal-containing layer 112 can comprise the compositions described previously with reference to metal-containing layer 20 of FIG. 1.

A silicon-containing layer 114 is formed over metal-containing layer 112, and is shown formed directly against (i.e., in physical contact with) the metal-containing layer.

Silicon-containing layer 114 can comprise any suitable form of silicon, including, for example, amorphous silicon or polycrystalline silicon, and in particular aspects can comprise, consist essentially of, or consist of silicon or Si/Ge. Layer 114 can be electrically conductive through incorporation of conductivity-enhancing dopant, or can be electrically insulative if the layer is not conductively doped. Layer 114 is shown to be electrically insulative at the processing stage of FIG. 7, but it is to be understood that the layer could alternatively be conductively doped, similarly to the conductively-doped layer 22 shown in FIG. 1. Layer 114 can be particularly advantageous if an upper surface of pedestal 104 does not comprise silicon (e.g., if an upper surface of the pedestal consists of metal or non-silicon-containing metal-compounds) in that layer 114 can be a source of silicon in subsequent formation of metal silicide from metal of layer 112. In applications in which the upper surface of pedestal 104 does not comprises silicon, it can be advantageous that layer 114 be relatively thick, with an exemplary thickness being greater than or equal to about 400 Å, and in some applications greater than or equal to about 500 Å.

Referring to FIG. 8, layer 112 (FIG. 7) has been subjected to appropriate processing to convert the layer to a metal silicide 120. Such processing can be identical to that described above with reference to FIGS. 1 and 2 for converting metal-containing layer 20 (FIG. 1) to metal silicide layer 26 (FIG. 2). Layer 110 is shown expanded in FIG. 8 relative to FIG. 7, to indicate that layer 110 was metal-enriched at the processing stage of FIG. 7, and incorporated silicon into a silicide during the conversion of metal-containing layer 112 to silicide 120.

Layer 114 is shown to be converted to a conductive material at the processing stage of FIG. 8. Such can occur by implanting suitable conductivity-enhancing dopant into silicon-containing layer 114.

An electrically insulative cap 122 is formed over conductively-doped layer 114. Cap 122 can comprise, for example, silicon nitride.

At the processing stage of FIG. 7, layer 110 can have an exemplary thickness of, for example, about 50 Å; layer 112 can have exemplary thickness of, for example, about 200 Å; and layer 114 can have exemplary thickness of, for example, about 500 Å. After the conversion of layer 112 to metal suicide layer 120, and incorporation of silicon into layer 110 to convert additional metal within layer 110 to silicide (i.e., at the processing stage of FIG. 8), layer 110 can have a thickness of, for example, about 100 Å, and layer 120 can have a thickness of, for example, about 400 Å. Insulative material cap 122 can have a thickness of, for example, about 1000 Å.

Referring to FIG. 9, layers 110, 120, 114 and 122 are patterned into a line 130. Such patterning can comprise, for example, photolithographic formation of a pattern photoresist block (not shown) followed by an appropriate etch and removal of the block.

Sidewall spacers 132 are formed along opposing sidewalls of line 130. Spacers 132 can comprise any suitable electrically insulative material, including, for example, one or both of silicon dioxide and silicon nitride.

Line 130 can be utilized as a bitline in integrated circuit constructions. Line 130 has a width "W", and such width can, like the above-described width of wordline 30, be less than or equal to 0.25 micrometers, less than or equal to 0.15 micrometers, and even less than or equal to 0.11 micrometers. Further, in applications in which layer 120 comprises, consists essentially of, or consists of titanium silicide, the layer can have a resistance of less than or equal to 20 micro-ohm-cm while the width is less than or equal to 0.11 micrometers.

Bitline 130 can be utilized in numerous memory arrays, and in particular aspects can be utilized as a buried digit line in a DRAM array.

The embodiments described above are exemplary embodiments, and it is to be understood that the invention encompasses other aspects besides those specifically illustrated. In some aspects, various processing steps can be combined. For instance a silicon nitride cap 24 of the first embodiment of the invention, or 122 of the second embodiment can, in particular aspects, be formed together with the anneal of a metal-containing layer to form metal silicide. The cap formation typically occurs at temperatures of about 760° C. or higher.

Metal silicide formed in accordance with methodology of the present invention can be stable at high temperature. Specifically, titanium silicide of the present invention has been subjected to 950° C. for 20 seconds during a $N_2$ rapid thermal process, and was found to maintain low resistance and flat surfaces (i.e., there was no detectible agglomeration). Typically, if titanium silicide formed by prior art processes is heated to temperatures in excess of 900° C., it agglomerates.

Constructions formed in accordance with methodology of the present invention (such as the above-described wordlines, bitlines and DRAM cells) can be utilized in numerous assemblies, including, for example, computer systems and other electronic systems.

Figure 10:
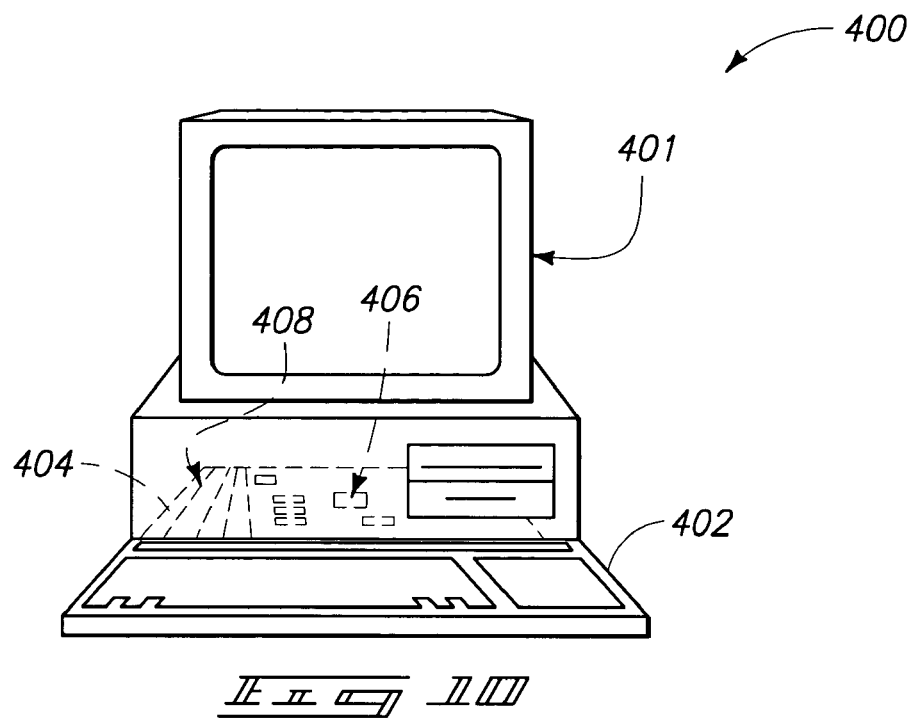
FIG. 10 is a diagrammatic view of a computer illustrating an exemplary application of the present invention.
Figure 11:
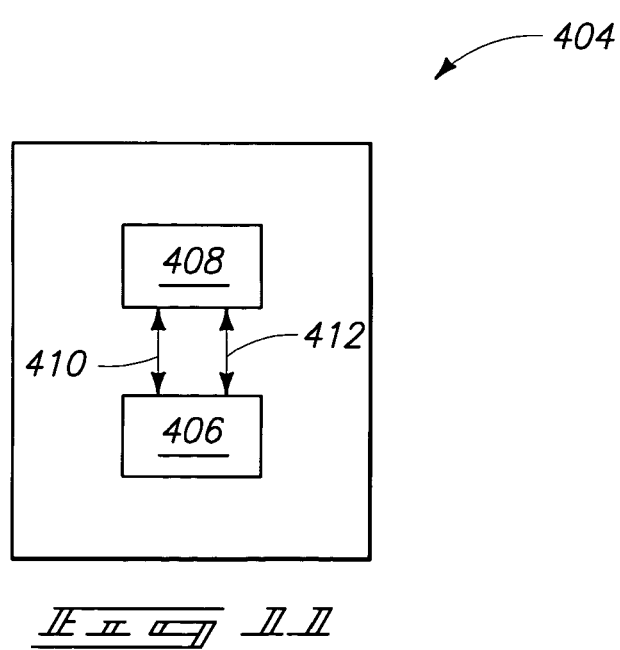
FIG. 11 is a block diagram showing particular features of the motherboard of the FIG. 10 computer.

FIG. 10 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the wordlines, bitlines and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 11. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 12:
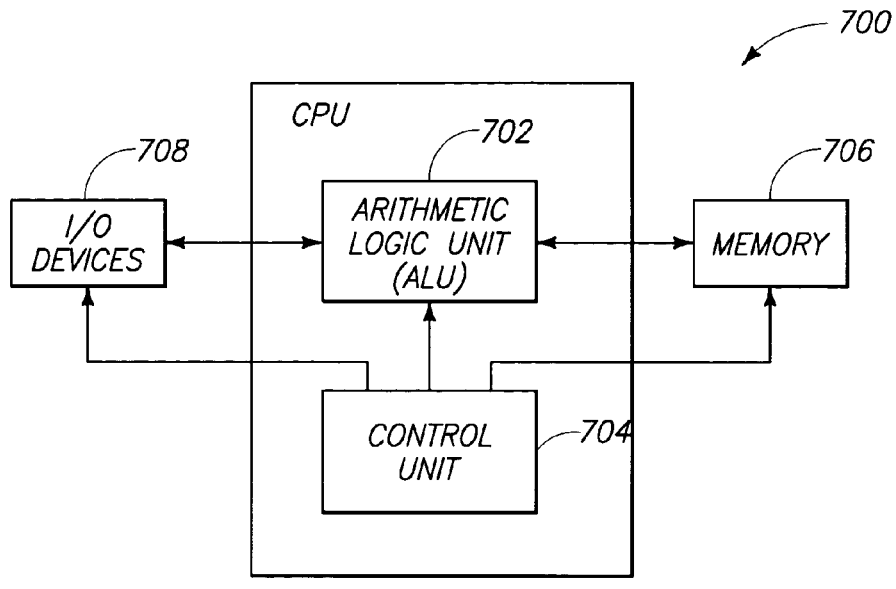
FIG. 12 is a high-level block diagram of an electronic system according to an exemplary aspect of the present invention.

FIG. 12 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells, wordlines and bitlines in accordance with various aspects of the present invention.

Figure 13:
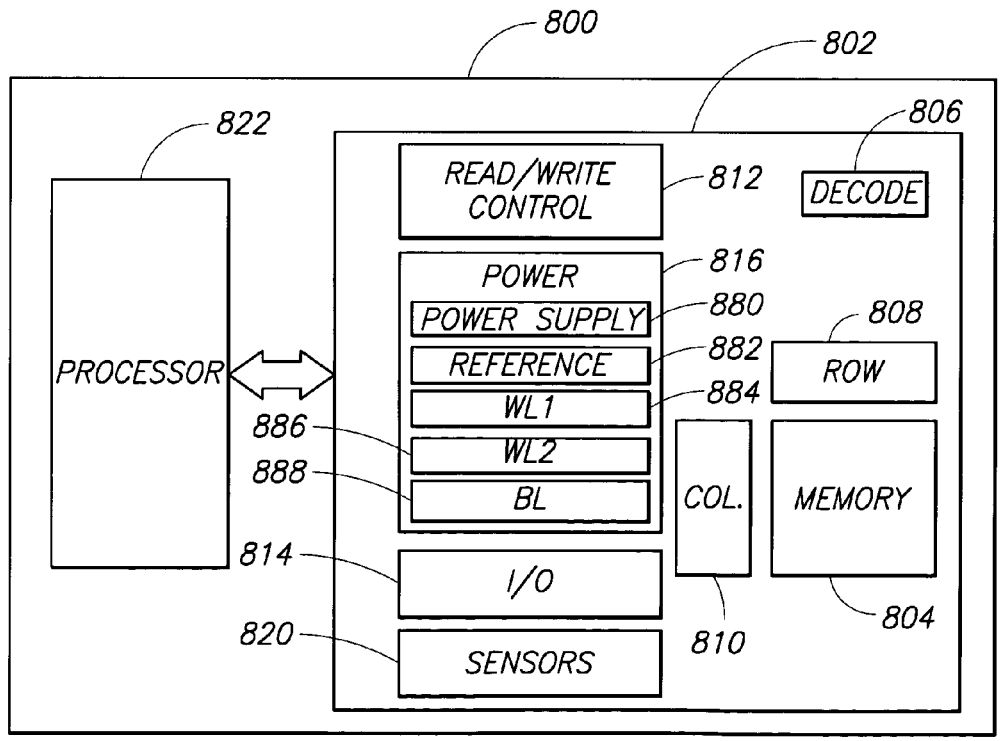
FIG. 13 is a simplified block diagram of an exemplary electronic system according to an aspect of the present invention.

FIG. 13 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells, wordlines and bitlines can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a low electrical resistance metal silicide, comprising:

forming a first metal silicide layer over a substrate, the first metal silicide layer having a melting point higher than 1700° C. and being metal-enriched, the first metal silicide layer having a thickness of at least about 50 Å and comprising a predominate metal;

depositing a metal-containing layer directly against the first metal silicide layer; the metal of the metal-containing layer predominately being a metal different than the predominant metal of the first metal silicide;

forming a silicon-containing layer directly against the metal-containing layer and on an opposing side of the metal-containing layer from the first metal silicide layer;

after forming the silicon-containing layer, converting the metal of the metal-containing layer to metal silicide to convert the metal-containing layer to a second metal silicide layer over the substrate; the second metal silicide layer having a bulk resistance of less than 30 micro-ohms-centimeter; the conversion of the metal of the metal-containing layer to the second metal silicide layer comprising incorporation of silicon from the silicon-containing layer into the second metal silicide layer; and patterning the first metal silicide layer, second metal silicide layer and silicon-containing layer into a line having substantially vertical sidewalls extending along the first metal silicide layer, second metal silicide layer and silicon-containing layer.

2. The method of claim 1 wherein the first metal silicide layer is formed on a non-silicon-containing electrically conductive material.

3. The method of claim 1 wherein the silicon-containing layer consists essentially of silicon or conductively-doped silicon.

4. The method of claim 1 further comprising forming a layer comprising silicon nitride over the silicon-containing layer, and wherein the patterning also patterns the layer comprising silicon nitride into the line.

5. The method of claim 1 wherein the substrate comprises silicon, and wherein the first metal silicide layer is formed directly against the silicon of the substrate.

6. The method of claim 1 wherein the first metal silicide layer consists essentially of tantalum silicide, and wherein the second metal silicide layer consists essentially of titanium silicide.

* * * * *